(12) United States Patent
Stopel

(10) Patent No.: US 7,298,198 B2
(45) Date of Patent: Nov. 20, 2007

(54) CHARGE PUMP

(75) Inventor: Rick Franciscus Jozef Stopel, Singapore (SG)

(73) Assignee: NXP B.V., Eindhoven (NL)

( * ) Notice: Subject to any disclaimer, the term of this patent is extended or adjusted under 35 U.S.C. 154(b) by 99 days.

(21) Appl. No.: 10/575,480

(22) PCT Filed: Oct. 15, 2004

(86) PCT No.: PCT/IB2004/052114

§ 371 (c)(1),
(2), (4) Date: Apr. 18, 2006

(87) PCT Pub. No.: WO2005/039032

PCT Pub. Date: Apr. 28, 2005

(65) Prior Publication Data

US 2007/0063760 A1    Mar. 22, 2007

(30) Foreign Application Priority Data

Oct. 21, 2003  (EP) ................... 03103877

(51) Int. Cl.
  *G05F 1/10*  (2006.01)
(52) U.S. Cl. ..................................... 327/536
(58) Field of Classification Search ................ 327/535, 327/536, 537
See application file for complete search history.

(56) References Cited

U.S. PATENT DOCUMENTS 5,532,653 A * 7/1996 Adkins ...................... 331/143
5,808,506 A * 9/1998 Tran .......................... 327/537
6,026,002 A * 2/2000 Viehmann ................... 363/60

* cited by examiner

*Primary Examiner*—Jeffrey Zweizig

(57) ABSTRACT

A charge pump comprises a single voltage multiplier stage (1) which converts an input voltage (VDD) into an output voltage (Vo) under control of a clock signal (Q, Qn; CLKO). An oscillator (2) receives the input voltage (VDD) to generate the clock signal (Q, Qn; CLKO) having a repetition period (Tr1, Tr2) which is substantially proportional to a squared input voltage ($VDD^2$).

8 Claims, 5 Drawing Sheets

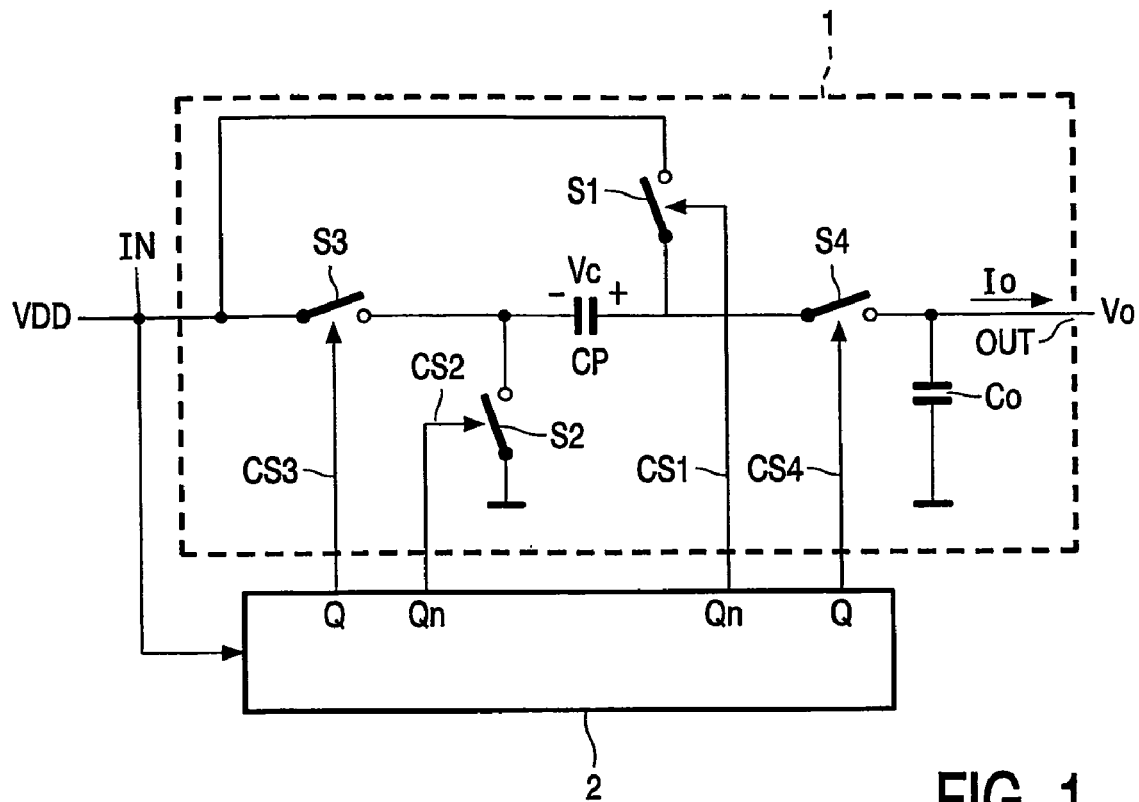
FIG. 1
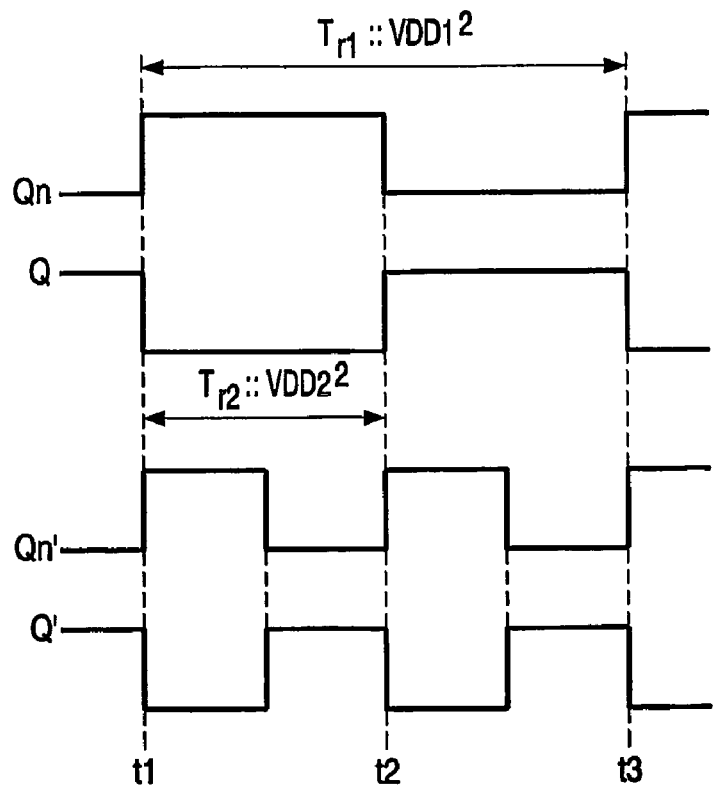
FIG. 2A
FIG. 2B
FIG. 2C
FIG. 2D

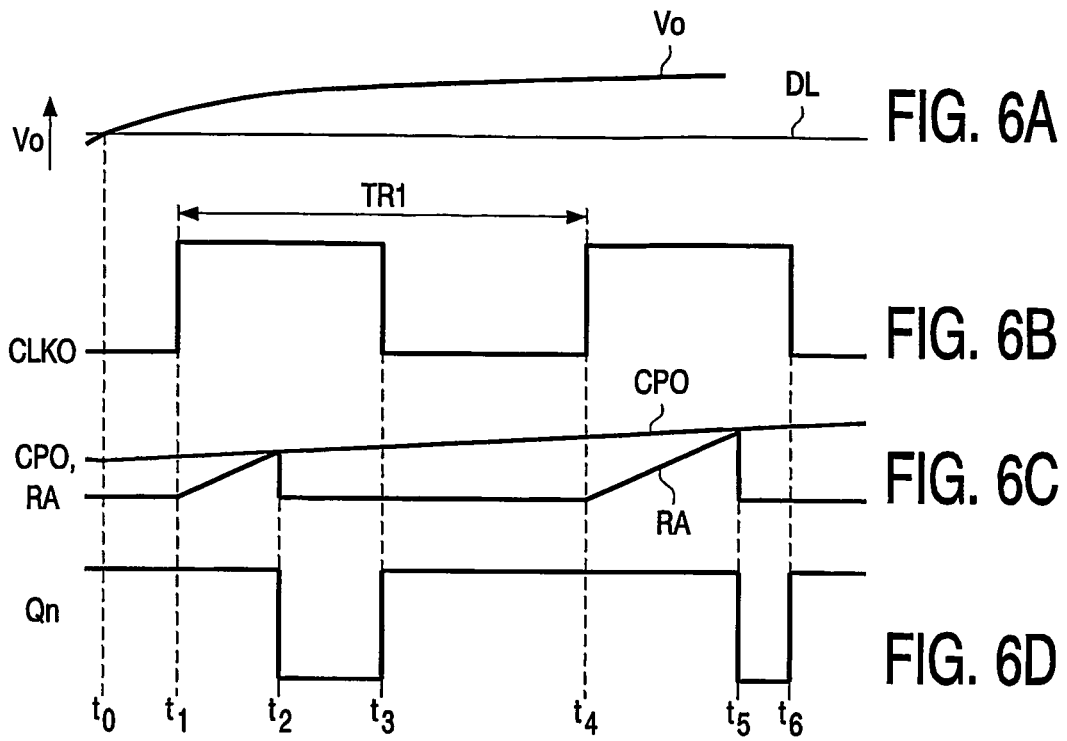
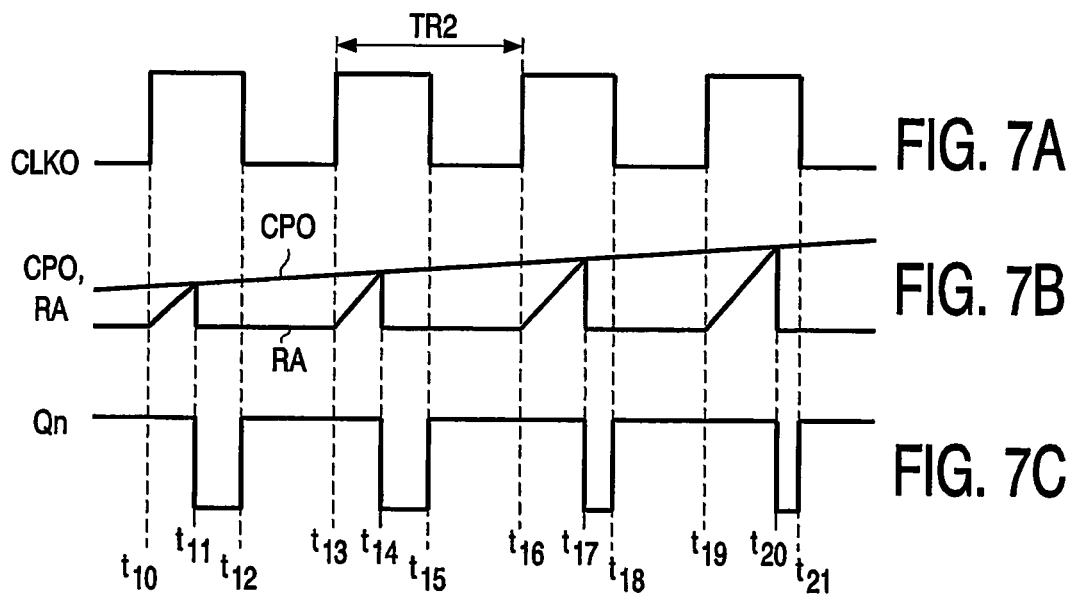

CHARGE PUMP

The invention relates to a charge pump, an integrated circuit for a charge pump, a mobile device comprising such a charge pump, and a USB master device comprising such a charge pump.

U.S. Pat. No. 5,808,506 discloses a MOS charge pump used in a non-volatile memory. A current controlled oscillator generates the clock for the charge pump voltage multiplier. The oscillator period is proportional to the input voltage. If the input voltage decreases, the oscillator period decreases and thus the oscillator frequency increases. If the input voltage decreases, the charge pumped to the output of the charge pump decreases. The corresponding increase of the oscillator frequency compensates for the decrease of the charge. It is required that under the worst case condition of minimum input voltage, the open circuit voltage of the charge pump is above the intended regulated output voltage, and that the increase of the oscillator frequency is adequate to keep the charge pump output current high enough to maintain the output voltage regulated in the loaded state.

It is a drawback of the known charge pump that the maximum current which is supplied by the charge pump can be relatively large at high input voltages.

It is an object of the invention to provide a charge pump of which the maximum output current is less dependent on variations of the input voltage.

A first aspect of the invention provides a charge pump as claimed in claim 1. A second aspect of the invention provides an integrated circuit as claimed in claim 6. A third aspect of the invention provides a mobile device as claimed in claim 7. A fourth aspect of the invention provides a USB master device as claimed in claim 8. Advantageous embodiments are defined in the dependent claims.

The charge pump in accordance with the first aspect of the invention comprises a single voltage multiplier stage. The single voltage multiplier stage converts an input voltage into an output voltage under control of a clock signal. The oscillator which generates the clock signal receives the input voltage to control a repetition period of the clock signal to be substantially proportional to the squared input voltage. Consequently, the maximum output current of the single voltage multiplier stage is substantially independent of the input voltage. Such an oscillator, which is able to supply a clock signal with a repetition period which is proportional to the squared input control signal, may be constructed in accordance with any of many known implementations. By contrast, in the charge pump disclosed in U.S. Pat. No. 5,808,506 the repetition period of the clock signal is proportional to the input voltage to obtain a regulated output voltage.

In the following it will be explained that the output current of the charge pump is substantially independent of the input voltage if the oscillator frequency is inversely proportional to the squared input voltage. The charge pump as such and its operation are well known. In short, during each repetition period of the clock signal, first a capacitor is charged to the input voltage. Then, the charged capacitor is switched in-between the input and the output of the charge pump such that the output voltage is the sum of the input voltage and the voltage across the charged capacitor. The output voltage is larger than the input voltage because the input voltage and the voltage across the capacitor have the same polarity. The energy stored in the charged capacitor is equal to $$EC=0.5*CP*VDD^2$$

wherein EC is the energy stored in the capacitor CP and VDD is the input voltage.

The energy required at the output of the charge pump is $$EO=Vo*Io*Tclk$$

wherein EO is the energy requested at the output of the charge pump, Vo is the output voltage of the charge pump, Io is the output current of the charge pump and Tclk is the repetition period of the clock signal supplied by the oscillator to the charge pump.

When the input charge EC and the output charge EO are in balance:

$$Tclk=(0.5*CP*VDD^2)/(Vo*Io).$$

Consequently, if a substantially constant output current is desired while the output voltage is substantially stabilized, the repetition period of the clock signal should be substantially proportional to the squared input voltage. Or, the repetition frequency of the clock signal should be substantially inversely proportional to the squared input voltage.

In an embodiment in accordance with the invention as claimed in claim 2, the oscillator has an input to receive a control signal. The repetition period of the clock signal supplied by the oscillator is substantially linearly dependent on the control signal. Such an oscillator is well known in the art. A control circuit receives the input voltage and supplies the control signal which is substantially proportional to the squared input voltage. Such a control circuit is well known in the art. For example, the control circuit may be a multiplier which multiplies the input signal with itself, or the control circuit comprises a table look up memory, or a MOSFET arranged as a diode between the input signal and a fixed reference voltage to obtain a current through the MOSFET which is substantially proportional to the squared voltage difference across the MOSFET.

In an embodiment in accordance with the invention as claimed in claim 3, the oscillator supplies a clock signal of which the repetition period depends on a charging or discharging bias current supplied to a capacitor. Now the control circuit supplies the bias current which is substantially proportional to the squared input voltage.

In an embodiment in accordance with the invention as claimed in claim 4, the charge pump further comprises a duty cycle modulator to modulate a duty cycle of the clock signal in response to the output voltage to obtain a substantially constant output voltage. The duty cycle of the clock signal determines the charging time of the capacitor during the first part of a repetition period of the clock signal and thus the amount of charge stored in the capacitor. At a smaller duty cycle the capacitor is connected to the input voltage during a shorter period of time and thus will be less charged. During the second part of the repetition period of the clock signal, the capacitor is connected in series with the input voltage to supply the output current.

In an embodiment in accordance with the invention as claimed in claim 5, the duty cycle modulator comprises a comparator which compares the output voltage of the charge pump with a reference voltage to obtain a comparison signal. A first integrator generates a first saw-tooth signal which has successively a rising and a falling slope dependent on whether the comparison signal indicates that the output voltage is above or below the reference voltage, or the other way around. A second integrator generates a second saw-tooth signal having a slope dependent on the squared input voltage. A comparator compares the first saw-tooth signal and the second saw-tooth signal. This approach has the advantage that the second saw-tooth has a slope proportional to the squared input voltage. The duty cycle control operates optimally, substantially independent of the input voltage.

These and other aspects of the invention are apparent from and will be elucidated with reference to the embodiments described hereinafter.

In the drawings:

FIG. 1 shows a charge pump with a single voltage multiplier stage and a block diagram of an oscillator for controlling the switches of the charge pump, FIG. 2 shows signals occurring in the charge pump for elucidating its operation, FIG. 3 shows a block diagram of the oscillator, FIG. 4 shows a detailed circuit diagram of another embodiment of the oscillator and a control circuit which controls the oscillator, FIG. 5 shows a block diagram of a duty cycle modulator in accordance with an embodiment of the invention, FIG. 6 shows signals elucidating the operation of the duty cycle modulator at a relatively low repetition frequency of the oscillator, and FIG. 7 shows signals elucidating the operation of the duty cycle modulator at a relatively high repetition frequency of the oscillator.

FIG. 1 shows a charge pump and a block diagram of an oscillator for controlling the switches of the charge pump. The charge pump 1 comprises a single voltage multiplier stage. A series arrangement of a switch S3, a capacitor CP and a switch S4 is arranged between the input IN and the output OUT of the charge pump 1. The input IN receives the input voltage VDD, the output OUT supplies the output voltage Vo and the output current Io to a load (not shown). A switch S2 is arranged between the junction of the switch S3 and the capacitor CP and ground. The switch S2 may be connected to a potential other than ground. A switch S1 is arranged between the junction of the capacitor CP and the switch S4 and the input IN. A storage capacitor Co is arranged between the output and ground or another reference potential. The oscillator 2 generates control signals CS1 to CS4 which are supplied to the switches S1 to S4, respectively. The control signals CS1 and CS2 are connected to the same signal Qn supplied by the oscillator 2. The control signals CS3 and CS4 are connected to the same signal Q supplied by the oscillator 2. The signal Qn is the inverted signal Q.

It is common use to refer to the control signals as CS1 to CS2 and thus to the clock signal(s) as Q and Qn. The clock signal clocks the charge pump to perform the voltage up-conversion. The oscillator 2 in accordance with the invention generates a clock signal which has a repetition period which is proportional to the squared input voltage $VDD^2$. Thus, in the charge pump shown in FIG. 1, the clock signal comprises the signal Q and its inverted signal Qn which both have a repetition period which is proportional to the squared input voltage $VDD^2$. The operation of the charge pump is elucidated with respect to the signals shown in FIG. 2.

FIG. 2 shows signals occurring in the charge pump for elucidating its operation. FIG. 2A shows the signal Qn supplied by the oscillator 2 at a predetermined value VDD1 of the input voltage VDD at which the repetition period of the oscillator is Tr1. FIG. 2B shows the signal Q which is the inverted signal Qn. FIG. 2C shows the signal Qn' supplied by the oscillator 2 at another, lower predetermined value VDD2 of the input voltage VDD at which the repetition period of the oscillator Tr2 is shorter than the repetition period Tr1. FIG. 2D shows the signal Q' which is the inverted signal Qn'. FIG. 2 indicate that the repetition period Tr1, Tr2 of the clock signal depends on the level VDD1, VDD2 of the input voltage VDD in that the repetition period Tr1, Tr2 is proportional to the squared input voltage $VDD^2$.

The operation of the charge pump is elucidated with respect to FIGS. 2A and 2B, thus when the value of the input voltage VDD is VDD1. It is assumed that a high level of the signals Q and Qn indicates that the associated ones of the switches S1 to S4 are closed, while a low level indicates that the associated switches are opened. This may, of course, be the other way around depending on the switches used. Usually, the switches are transistors, such as MOSFETs.

At instant t1, the signal Qn becomes high: the switches S1 and S2 are closed, and the signal Q becomes low: the switches S3 and S4 are opened. The input voltage VDD is connected across the capacitor CP and the voltage Vc across the capacitor CP increases. At the instant t2, the signal Qn becomes low: the switches S1 and S2 are opened, and the signal Q becomes high: the switches S3 and S4 are closed. Now, the capacitor CP is arranged in series with the input voltage VDD and the output voltage Vo of the charge pump is equal to the input voltage plus the voltage Vc across the capacitor CP.

FIG. 3 shows a block diagram of the oscillator. The oscillator shown comprises an oscillator circuit OC and a control circuit CC. The control circuit CC receives the input voltage VDD and supplies a control signal CS which is proportional to the squared input voltage $VDD^2$. The oscillator circuit OC receives the control signal and supplies the clock signal Q, CLKO. The oscillator circuit OC may be any oscillator of which the frequency is controllable by a control signal CS to obtain a repetition frequency of the oscillator signal Q, CLKO which is linearly dependent on the control signal CS.

FIG. 4 shows a detailed circuit diagram of another embodiment of the oscillator and a control circuit which controls the oscillator. The oscillator is obtained by using for example MOSFETs. It is possible to replace the MOSFETs by other suitable semiconductor elements. Preferably the oscillator is integrated in an integrated circuit. MOSFETs referred to as MPi are P-channel MOSFETs, MOSFETs referred to as MNi are N-channel MOSFETs.

The P-channel MOSFET MP1 has a main current path arranged between the input voltage VDD of the charge pump and a reference potential VSS which may be considered to be ground potential. The gate of the MOSFET MP1 is connected to the reference potential VSS. The MOSFET MP1 operates as a diode. The current Id through this diode MP1 is $$Id = K\ W/L(VDD-Vt)^2$$

wherein K is a constant, W/L is the width/length ratio of the MOSFET MP1, and Vt is the threshold voltage.

Thus, the current Id is substantially proportional to the squared input voltage VDD. A small inaccuracy is caused by the threshold voltage Vt. This current Id is mirrored by the MOSFET MP2 which forms a current mirror with the MOSFET MP1. The current Id1 which flows in the main current path of the MOSFET MP2 is the mirrored version of the current Id. The current Id1 may be equal to, or bear a fixed relation with, the current Id, dependent on the ratio of the width/length ratios of the MOSFETs MP1 and MP2. The current Id1 is mirrored by the N-channel MOSFETs MN3 and MN4 to obtain the current Id2. The current Id2 is mirrored by the MOSFETs MP3 and MP4 to obtain the current Isq. All the currents Id, Id1, Id2, Isq have a fixed ratio and thus all are proportional to the squared input voltage $VDD^2$.

The current Isq is supplied to a trans-linear amplifier which comprises the MOSFETs MP5, MP6, MP7 and MP8. This trans-linear amplifier supplies at its output a current 1/Isq which is the inverse of the input current Isq of the trans-linear amplifier. A reference current source Iref supplies a current which is mirrored via the MOSFETs MN1, MN2 to obtain the reference current Iref. The current Iref through the main current paths of the MOSFETs MP5 and MP6 is fixed. Thus, a current variation in the main current path of MOSFET MP7 results in an opposite variation of the current 1/Isq through the main current path in the MOSFET MP8.

The source of the MOSFET MP8 supplies the current 1/Isq to the oscillator which comprises current mirrors obtained by the MOSFETs MN5, MN6, MN7 and MN8 which supply the mirrored currents Io. The currents Io all are proportional to 1/Isq and thus to $1/VDD^2$. The MOSFETs MP13 and MP14 behave as capacitors. Instead of MOSFETs also internal or external capacitors may be used. The MOSFET's MP9 and MP10 are switches which connect the capacitors MP13 and MP14 to the input voltage VDD. The MOSFET's MN9 and MN10 are switches which discharge the capacitors MP13 and MP14 with the current Io. The voltage on the capacitor MP13 is referred to as INT1, the voltage on the capacitor MP14 is referred to as INT2.

The gates of the MOSFETs MN9 and MP9 receive an inverted clock signal CLKn, the gates of the MOSFETs MP10 and MN10 receive the clock signal CLK. The voltage DET1 at the source of the MOSFET MP11 assumes a high level when the voltage INT1 drops below a predetermined value. The voltage DET2 at the source of the MOSFET MP12 assumes a high level when the voltage INT2 drops below a predetermined value. The logical circuit which comprises the logical NORs 120, 121, 124 and 125 receives the voltages DET1, DET2 and supplies the clock signal CLK and the inverted clock signal CLKn.

The operation of the oscillator is elucidated starting from a low level of the clock signal CLK and thus a high level of the clock signal CLKn. The capacitor MP13 is being discharged by the current Io, and the capacitor MP14 is connected to VDD. Thus, the voltage INT1 on the capacitor MP13 is decreasing while the voltage INT2 on the capacitor MP14 is constant and high. The high voltage on the capacitor MP14 causes the voltage DET2 to be low because MP12 is turned off and the current Io can't flow through MP12. The voltage on the capacitor MP13 decreases until the MOSFET MP11 trips at the predetermined threshold level VT of the MOSFET. As for the logic NOR gates 120, 121, 124, 125, the jump of the voltage DET1 from a low value to a high value will result in a low level on the output of the NOR gate 120. This low level together with the low level of the voltage DET2 will make the level of the output of the NOR 121 high. The high level on the output of the NOR 121 will result in a low level on the output of the NOR 124. The output of the NOR 124 is the inverted clock signal CLKn. This low level together with the low level from the output of the NOR 120 will give a high level at the output of the NOR 125. The output of the NOR 125 is the clock signal CLK. It is demonstrated that the clock signal CLK and inverted clock signal CLKn have a reverse polarity. The sequence will start again, but now the capacitor MP14 is discharged by a current Io while the capacitor MP13 is switched to the input voltage VDD. It is clear that the high period and the low period of the clock signals CLK and CLKn both are determined by the values of the capacitors MP13 and MP14 and the value of the current Io. If the capacitors MP13 and MP14 have equal values, the duty cycle of the clock signals CLK and CLKn will be 50%.

Because the trip levels of the MOSFETs MP11 and MP12 are referenced to VDD (the threshold voltage VT of the MOSFETs MP11, MP12) and the period of time required to discharge the capacitors MP13 and MP14 from the input voltage VDD to the trip level is determined by the current Io and the capacitance of the MOSFETs MP13, MP14, (?) the capacitors MP13, MP14 are basically integrating capacitors. The time to discharge the capacitors MP13/MP14 is $T=C_{MP13/MP14}*(VT)/Io$. Both the capacitors MP13, MP14 and the delta voltage across the capacitors MP13, MP14 are independent of the input voltage VDD. The current Io is proportional to $1/VDD^2$. Consequently, the repetition period T varies with the squared input voltage $VDD^2$. Thus, if the input voltage VDD is low, the repetition period T is small to increase the charge supplied at the output of the charge pump.

The MOSFETs MP15, MP16, MN17, MN18 form a buffer which buffers the clock signal CLK to obtain the buffered clock signal CLKO which in FIGS. 1 and 5 is used to generate the signals Q and Qn. The clock signal CLK generated in this manner has a repetition period which is proportional to the squared input voltage $VDD^2$ which has the advantage that the maximum output current is substantially independent of the level of the input voltage VDD.

It is a further advantageous that the frequency of the oscillator is substantially independent of temperature and process tolerances. This is due to the fact that the diode MP1 and the capacitors MP13 and MP14 are all P-channel MOSFETs and thus behave in the same manner, while the current Id through the diode MP1 and the current Io through the capacitors MP13, MP14 have an inverse behavior. For example, when the temperature decreases, the current Isq increases, and the output current 1/Isq of the trans-linear amplifier decreases. Thus, the bias current Io for the oscillator decreases when the temperature decreases. At a lower temperature, the same discharge curve is obtained if the capacitors MP13 and MP14 are discharged at a slower rate. This is exactly what happens because the bias current Io is smaller at a lower temperature. Also with respect to process variations a compensating effect is present. In a slow process, the current Id is smaller and thus the bias current Io of the oscillator is larger. This higher discharge current of the capacitors MP13 and MP14 is counteracted by the lower mobility of the MOSFETs MP13 and MP14.

FIG. 5 shows a block diagram of a duty cycle modulator. A resistor tap comprises the series arranged resistors R1 and R2. This series arrangement is arranged between the output voltage Vo of the charge pump and a reference potential which in FIG. 4 is ground. A comparator COM1 has an inverting input which is connected to the junction of the series arranged resistors R1 and R2 to receive a voltage Vt which is the tapped-in (?) output voltage Vo. The comparator COM1 has a non-inverting input which receives a reference voltage Vr. The output signal COS of the comparator COM1 controls a switch S5 which is arranged in series with a current source CU1 which supplies a current 2*Isc. The current source CU1 supplies the current 2*Isc to a capacitor C2 if the switch S5 is closed. A current source CU2 is arranged in parallel with the capacitor C2 and supplies a current Isc which is withdrawn from the capacitor C2.

Thus, the voltage CPO at the capacitor C2 will linearly decrease due to the current Isc which is withdrawn from the capacitor C2 when the switch S5 is open. The voltage CPO will linearly increase due to the current Isc=2*Isc−Isc which flows into the capacitor C2 when the switch S5 is closed. Consequently, the signal CPO is sawtooth shaped with a rising slope if the tapped-in output voltage Vt is higher than the reference voltage Vr and with a falling slope if the tapped-in output voltage is lower than the reference voltage Vr. Usually, the output voltage Vo is the highest voltage available and it is required to tap-in this output voltage Vo to be able to compare it, by using the comparator COM1, with the reference level Vr. If another, higher voltage is available, or if the comparator COM1 is able to compare the output voltage Vo directly with the reference voltage, the tapping-in may be omitted. Instead of providing the switch S5 in series with the current source CU1, the current source CU1 itself may be switched on and off. It is possible to implement a switch which switches the current 2*Isc to ground when the tapped-in output voltage Vt is below the reference level Vr. It is not essential that the current supplied by the current source CU1 is twice as large as the current supplied by the current source CU2. It suffices that the current supplied by the current source CU1 is larger than the current supplied by the current source CU2. Of course, the skilled person will have no problems understanding how to construct the complementary circuit, which uses capacitors connected to a high voltage instead of to ground and which has the same effect The current Io, which is proportional to the squared input voltage $VDD^2$, is fed to a capacitor C3 to generate a sawtooth shaped signal RA. A possible manner to generate the current Io is discussed with respect to FIG. 4. The comparator COM2 has an inverting input to receive the sawtooth signal CPO and a non-inverting input to receive the sawtooth signal RA. The output of the comparator COM2 is connected to a CL input of a Flip-Flop FF. The flip-flop FF has a data input D which is connected to the input voltage VDD to receive a high level, a reset input R which receives a clock signal CLK, an output which supplies the output signal Q and an inverting output which supplies the inverted output signal Qn which is the inverted version of the output signal Q. A logical NAND NA has an input which receives the inverted output signal Q, an input which receives the clock signal CLK, and an output which controls a switch F1. The switch F1 is shown to be a MOSFET of which the gate is connected to the output of the NAND NA, and of which the drain-source path is arranged in parallel with the capacitor C3. The clock signal CLKO is an output signal of the oscillator 2, which may be generated with the oscillator shown in FIG. 4. The clock signal CLKO has a repetition period Tr1, Tr2 which is proportional to the squared input voltage $VDD^2$ and which has a fixed duty cycle which preferably is 50%.

The operation of the duty cycle modulator will be elucidated with respect to FIGS. 6 and 7.

FIG. 6 shows signals elucidating the operation of the duty cycle modulator at a relatively low repetition frequency of the oscillator.

FIG. 6A shows the output voltage Vo and the desired level DL of the output voltage Vo. The output voltage Vo crosses the desired level DL at the instant t0 and is higher than the desired level DL from the instant t0 onwards.

Figure 3:
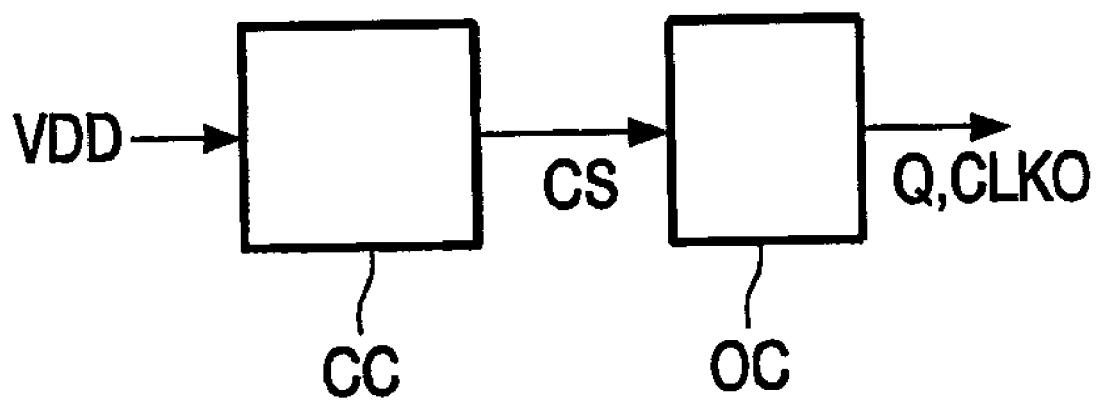
Figure 4:
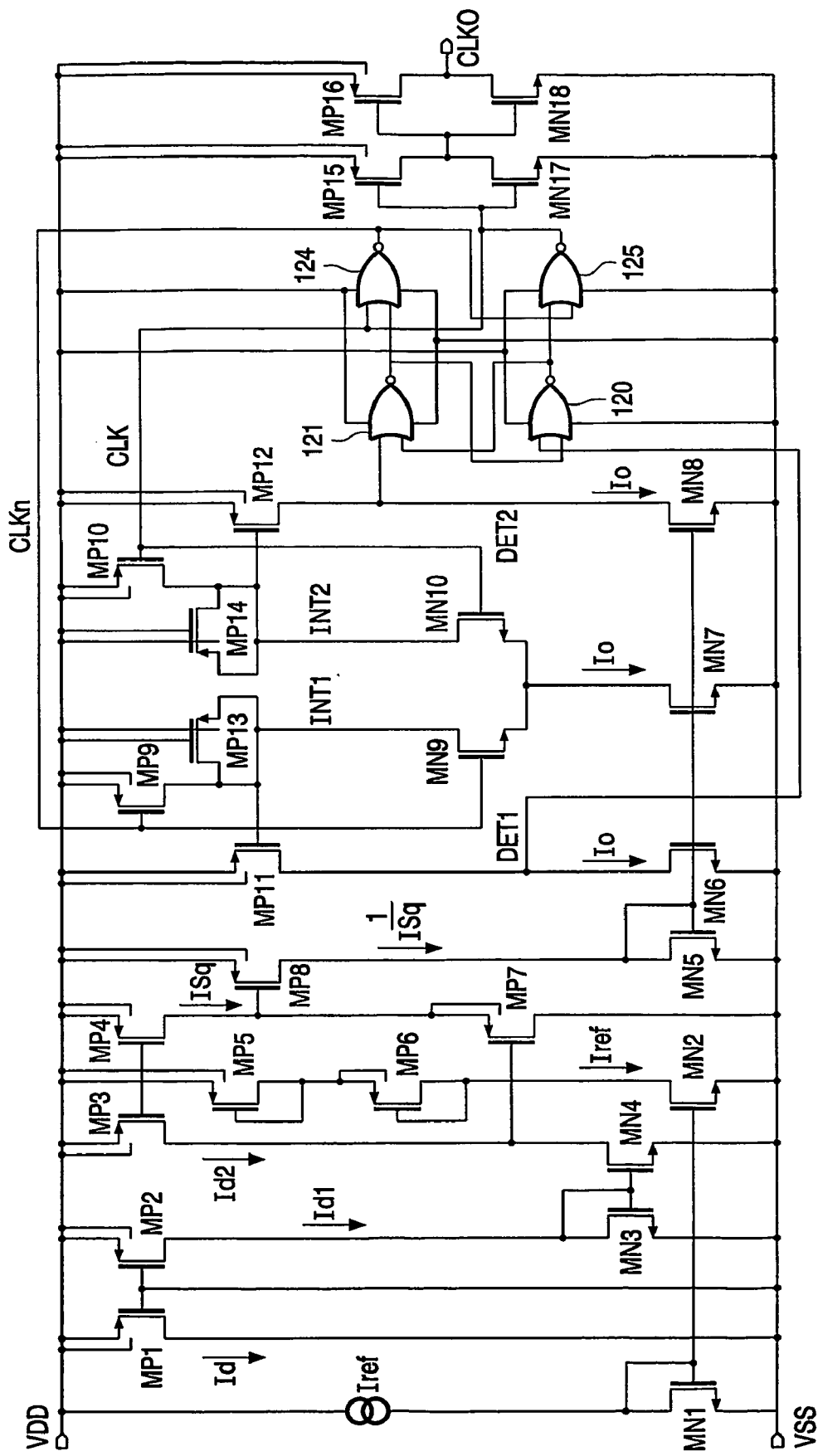

FIG. 6B shows the clock signal CLKO generated by the oscillator of FIG. 4 with a substantially 50% duty cycle and a repetition period TR1. The clock signal CLKO has rising edges at the instants t1 and t4, and falling edges at the instants t3 and t6. The repetition period TR1 lasts from the instant t1 to the instant t4.

FIG. 6C shows the sawtooth signals CPO and RA, and FIG. 6D shows the inverted output signal Qn. The sawtooth signal CPO has a falling slope until the instant t0 because the output voltage Vo is below the desired level DL. From the instant t0 onwards, the output voltage Vo is above the desired level DL and thus the sawtooth signal CPO has a rising slope. During the low level periods of the clock signal CLKO, the NAND NA causes the MOSFET F1 to be conductive and the capacitor C3 is short circuited. Consequently, the sawtooth signal RA has a low level up to the instant t1, from instant t3 to t4 and after instant t6. It is assumed that the inverted output signal Qn has a high level at the instants t0 and t1. Thus, at the instant t1 both the clock signal CLKO and the inverted output signal Qn are high, and the NAND NA controls the FET F1 to become non-conductive. The current Isc starts charging the capacitor C3 and the sawtooth signal RA starts to increase linearly. At the instant t2 the sawtooth signal RA reaches the sawtooth signal CPO. The comparator COM2 supplies a positive level to the clock input CL of the flip-flop FF and the high level at the data input D is clocked in. The inverted output signal Qn changes to a low level. The low level of the inverted output signal Qn causes the output signal of the NAND NA to get a high level and the FET F1 becomes conductive. Consequently, the sawtooth signal RA has a low level from the instant t2 to t3 and from the instant t5 to t6. At the instant t3, the clock signal CLKO changes to the low level and the flip-flop FF is reset: the inverted output signal Qn becomes high again.

As is shown in FIG. 6D, the inverted output signal Qn has a low level, of which the duration depends on the instant the sawtooth signal RA reaches the sawtooth signal CPO. The slope of the sawtooth signal CPO depends on the value of the output voltage Vo. If the output voltage Vo is below the desired level DL, the sawtooth signal CPO linearly decreases due to the current Isc. If the output voltage Vo is above the desired level DL, the sawtooth signal CPO linearly increases with the difference between the current 2*Isc supplied by the current source CU1 and the current Isc supplied by the current source CU2. It is not essential to the inventive idea that the current source CU1 supplies a current which is twice the current supplied by the current source CU2. It suffices if the current of the current source CU1 is larger than the current of the current source CU2. Instead of two current sources CU1 and CU2 it is also possible to use one current source which is able to generate a bi-directional current.

In the example shown in FIG. 6, the output voltage Vo is higher than the desired level DL from the instant t0 onwards. Consequently, the sawtooth voltage CPO continuously rises and the low level periods of the inverted output signal Qn decrease in time: the time difference between the instants t5 and t6 is smaller than the time difference between the instants t2 and t3. During the high level of the inverted output signal Qn, the switches S1 and S2 (see FIG. 1) are closed and the capacitor CP is charged. Usually, the on-time of the switches S1 and S2 is selected sufficiently long to charge the capacitor to the input voltage VDD. During the low level of the inverted output signal Qn, the switches S3 and S4 are closed and the charge stored in the capacitor CP can be supplied to the load. If the time during which the switches S3 and S4 are closed decreases, the charge which can be supplied to the load decreases. Consequently, the too high output voltage Vo causes less charge to be supplied to the load and thus the output voltage will start decreasing. If the output voltage Vo is lower than the desired level DL (not shown), the sawtooth CPO continuously decreases and the duration of the low period of the inverted output signal Qn increases. A larger part of the charge in the capacitor CP will be supplied to the load and the output voltage Vo will start rising.

FIG. 7 shows signals elucidating the operation of the duty cycle modulator at a relatively high repetition frequency of the oscillator. FIGS. 7A to 7C are comparable to FIGS. 6B to 6D, respectively. The differences are that the repetition frequency TR2 is shorter than the repetition frequency TR1, and that the current Io is larger.

FIG. 7A shows the clock signal CLKO generated by the oscillator shown in FIG. 4 at an input voltage VDD which is lower than the input voltage VDD to which FIGS. 6B to 6D are associated. In accordance with the invention, the repetition period TR1, TR2 is proportional to the squared input voltage $VDD^2$. Thus, the repetition period TR2 at a lower value of the input voltage VDD is shorter than the repetition period TR1 at a higher input voltage VDD. The clock signal CLKO has rising edges at the instants t10, t13, t16, t19 and falling edges at the instants t12, t15, t18, t21.

Figure 5:
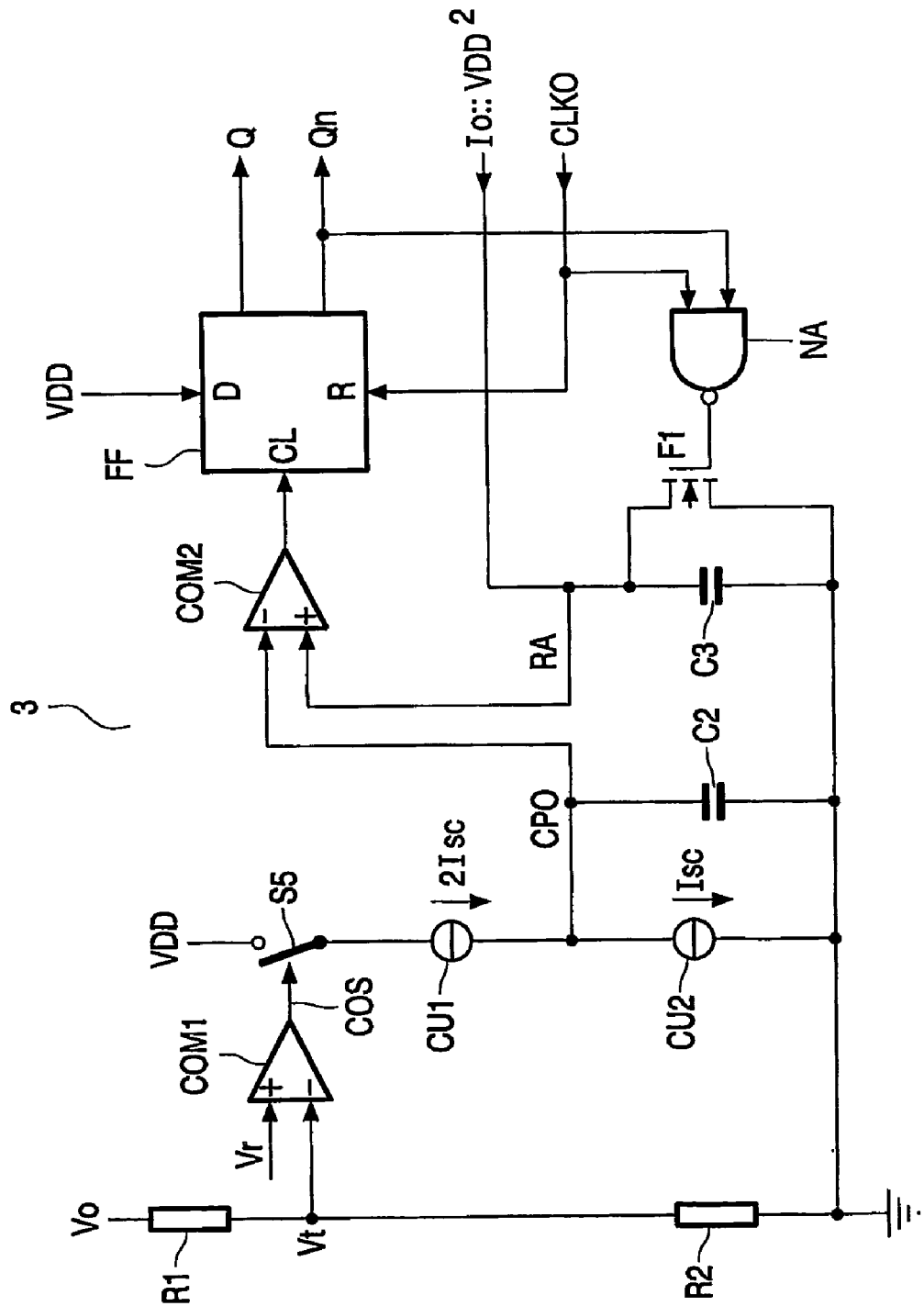

In FIG. 7B the sawtooth signals CPO and RA are shown. Again, the sawtooth signal CPO is linearly increasing because the output voltage Vo is higher than the desired level DL. The slope of the sawtooth signal CPO is identical to the slope at the higher input voltage VDD because the currents supplied by the current sources CU1 and CU2 are constant. The sawtooth signal RA again starts at the rising edges of the clock signal CLKO. The slope of the sawtooth signal RA is steeper that in FIG. 5C because the current Io which charges the capacitor C3 is proportional to the squared input voltage $VDD^2$. At the instant the sawtooth signals RA and CPO become equal, the inverted output signal Qn becomes low. The inverted output signal Qn stays low until the next falling edge of the clock signal CLKO occurs. Thus, the inverted output signal Qn has a low level during a period in time which gradually decreases (see the time periods t11 to t12, t14 to t15, t17 to t18, t20 to t21), in the same manner as shown in FIG. 6D. Thus, again the period in time during which the charge in the capacitor CP can be transferred to the load becomes shorter as the time during which the output voltage Vo is higher than the desired level DL is longer.

As becomes clear from FIG. 6 and FIG. 7, the duty cycle control, which regulates the output voltage Vo, is adapted to optimally perform at different input voltages VDD at which different repetition periods TR1, TR2 of the clock signal CLKO are generated by the oscillator. The repetition periods TR1, TR2 are proportional to the squared input voltage $VDD^2$. The current Isc which charges the capacitor C3 is also made proportional to the squared input voltage $VDD^2$. Consequently, still the whole high period of the clock signal CLKO is available for the duty cycle control independent of the actual value of the input voltage VDD and thus the actual clock repetition period TR1, TR2.

It has to be noted that the duty cycle control is independent of the actual repetition period TR1, TR2. The duty cycle control operates to regulate the output voltage Vo independent of the actual value of the input voltage VDD. The repetition period TR1, TR2 is controlled proportionally to the squared input voltage $VDD^2$ to obtain a substantially constant maximum output current Io of the charge pump. It is especially important to limit the output current Io of the charge pump if the charge pump is used in a mobile application which is battery powered, to extend the life of the battery.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A charge pump comprising:
    a single voltage multiplier stage (1) for converting an input voltage (VDD) into an output voltage (Vo) under control of a clock signal (Q, Qn; CLKO), and
    an oscillator (2) for receiving the input voltage (VDD) to generate the clock signal (Q, Qn; CLKO) having a repetition period (Tr1, Tr2) being substantially proportional to a squared input voltage ($VDD^2$).

2. A charge pump as claimed in claim 1, wherein the oscillator (2) comprises:
    a control circuit (CC) for receiving the input voltage (VDD) to supply a control signal (CS) being substantially proportional to the squared input voltage ($VDD^2$), and wherein the repetition period of the oscillator (2) is substantially linearly dependent on the control signal (CS).

3. A charge pump as claimed in claim 1, wherein the oscillator (2) comprises:
    a capacitor (MP13, MP14),
    a current source (MN7) for supplying a current (Io) to charge or discharge the capacitor (MP13, MP14),
    a control circuit (MP1) for receiving the input voltage (VDD) to supply a further current (1d) being substantially proportional to the squared input voltage ($VDD^2$), wherein the first mentioned current (Io) and the further current (1d) have a fixed ratio.

4. A charge pump as claimed in claim 1, wherein the charge pump further comprises a duty cycle modulator (3) for modulating a duty cycle of the clock signal (CLKO), the duty cycle modulator (3) comprises an input for receiving the output voltage (Vo) to adapt the duty cycle to obtain a substantially constant output voltage (Vo).

5. A charge pump as claimed in claim 4, wherein the duty cycle modulator (3) comprises:
    a first comparator (COM1) for comparing the output voltage (Vo) with a reference voltage (Vr) to supply a comparison signal (COS),
    a first integrator (C2) for generating a first saw-tooth signal (CPO) having a rising or falling slope dependent on whether the comparison signal (COS) indicates that the output voltage (Vo) is above or below the reference voltage (Vr), or the other way around,
    a second integrator (C3) for generating a second saw-tooth signal (RA) having a slope dependent on the squared input voltage ($VDD^2$), and
    a second comparator (COM2) for comparing the first saw-tooth signal (CPO) and the second saw-tooth signal (RA), the duty cycle being dependent on an instant the first saw-tooth signal (CPO) reaches the second saw-tooth signal (RA).

6. An integrated circuit for use in a charge pump comprising a single voltage multiplier stage (1) for converting an input voltage (VDD) into an output voltage (Vo) under control of a clock signal (Q, Qn; CLKO), the integrated circuit comprising:

an oscillator (2) for receiving the input voltage (VDD) to generate the clock signal (Q, Qn; CLKO) having a repetition period (Tr1, Tr2) being substantially proportional to a squared input voltage (VDD$^2$).

7. A mobile device having a charge pump comprising:

a single voltage multiplier stage (1) for converting an input voltage (VDD) supplied by a battery into an output voltage (Vo) under control of a clock signal (Q, Qn; CLKO), and an oscillator (2) for receiving the input voltage (VDD) to generate the clock signal (Q, Qn; CLKO) having a repetition period (Tr1, Tr2) being substantially proportional to a squared input voltage (VDD$^2$).

8. A USB master device having a charge pump comprising:

a single voltage multiplier stage (1) for converting an input voltage (VDD) into an output voltage (Vo) for a USB slave device under control of a clock signal (Q, Qn; CLKO), and an oscillator (2) for receiving the input voltage (VDD) to generate the clock signal (Q, Qn; CLKO) having a repetition period (Tr1, Tr2) being substantially proportional to a squared input voltage (VDD$^2$).

* * * * *